(12) United States Patent
Chen

(10) Patent No.: US 12,119,037 B2
(45) Date of Patent: Oct. 15, 2024

(54) REFRESH CIRCUIT, MEMORY, AND REFRESH METHOD

(71) Applicant: CHANGXIN MEMORY TECHNOLOGIES, INC., Hefei (CN)

(72) Inventor: Jixing Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 209 days.

(21) Appl. No.: 17/937,120

(22) Filed: Sep. 30, 2022

(65) Prior Publication Data

US 2023/0282265 A1  Sep. 7, 2023

Related U.S. Application Data

(63) Continuation of application No. PCT/CN2022/093950, filed on May 19, 2022.

(30) Foreign Application Priority Data

Mar. 4, 2022  (CN) .......................... 202210210837.3

(51) Int. Cl.
  *G11C 11/406* (2006.01)
  *G11C 11/408* (2006.01)
  *H03K 19/20* (2006.01)

(52) U.S. Cl.
  CPC ........ *G11C 11/406* (2013.01); *G11C 11/4087* (2013.01); *H03K 19/20* (2013.01)

(58) Field of Classification Search
  CPC . G11C 11/406; G11C 11/4087; G11C 11/408; G11C 11/4085
  See application file for complete search history.

(56) References Cited

U.S. PATENT DOCUMENTS

| | | | |
|---|---|---|---|
| 6,026,465 A | * | 2/2000 | Mills .................... G11C 7/1045 |
| | | | 711/E12.079 |
| 9,728,269 B2 | | 8/2017 | Park |
| 10,998,033 B2 | | 5/2021 | Yun |
| 2017/0117057 A1 | | 4/2017 | Park et al. |
| 2020/0185026 A1 | | 6/2020 | Yun et al. |
| 2021/0407570 A1 | | 12/2021 | Lim |
| 2022/0028460 A1 | * | 1/2022 | Kurose .................. G11C 16/26 |

FOREIGN PATENT DOCUMENTS

| | | |
|---|---|---|
| CN | 1763863 A | 4/2006 |
| CN | 111292789 A | 6/2020 |
| CN | 113838501 A | 12/2021 |

* cited by examiner

*Primary Examiner* — Han Yang
(74) *Attorney, Agent, or Firm* — Syncoda LLC; Feng Ma

(57) ABSTRACT

A refresh circuit includes a refresh counter configured to output address signals through a plurality of address pins; an address mixer configured to output row address selection signals according to the address signals received by the row address pins, output first bank address signals according to the address signals received by bank address pins, receive a refresh signal and a power supply voltage signal, and output fixed second bank address signals according to the refresh signal and the power supply voltage signal; and an address pre-decoding circuit configured to output a preset number of bank address selection signals according to the first bank address signals and the second bank address signals.

16 Claims, 7 Drawing Sheets ness of the DRAM.

REFRESH CIRCUIT, MEMORY, AND REFRESH METHOD

CROSS-REFERENCE TO RELATED APPLICATIONS

This is a continuation of International Patent Application No. PCT/CN2022/093950 filed on May 19, 2022, which claims priority to Chinese Patent Application No. 202210210837.3 filed on Mar. 4, 2022. The disclosures of the above-referenced applications are hereby incorporated by reference in their entirety.

BACKGROUND

A Dynamic Random Access Memory (DRAM) is a common semiconductor memory device in computers, and is composed of many repetitive memory cells, and different memory cells are selected through word lines and bit lines. In particular, the memory cells in the DRAM are periodically refreshed to ensure data validity.

However, for some memories with a non-binary structural capacity, the number of word lines selected are different in different refresh processes, which causes a refresh current to fluctuate, and thus affects the performance of the DRAM.

SUMMARY

The disclosure relates to the technical field of integrated circuits, and in particular to a refresh circuit, a memory and a refresh method, which ensures that the same number of word lines is turned on in each refresh operation, thereby alleviating the problem of unstable refresh current.

The technical solutions of the disclosure are implemented as follows.

A first aspect of the embodiments of the disclosure provides a refresh circuit, including a refresh counter, an address mixer and an address pre-decoding circuit.

The refresh counter includes a plurality of address pins, and configured to output address signals through the plurality of address pins.

The address mixer includes a plurality of row address pins and a plurality of bank address pins. The plurality of row address pins and the plurality of bank address pins are connected to different address pins respectively. The address mixer is configured to output row address selection signals according to the address signals received by the row address pins, output first bank address signals according to the address signals received by the bank address pins, receive a refresh signal and a power supply voltage signal, and output fixed second bank address signals according to the refresh signal and the power supply voltage signal.

The address pre-decoding circuit is configured to receive the first bank address signals and the second bank address signals, and configured to output a preset number of bank address selection signals according to the first bank address signals and the second bank address signals.

A second aspect of the embodiments of the disclosure provides a memory, including a refresh circuit and a memory circuit. The memory circuit includes a plurality of memory banks.

The refresh circuit is configured to output row address selection signals and a preset number of bank address selection signals.

The memory circuit is configured to select target memory banks according to the preset number of bank address selection signals, and determine target word lines in the target memory banks according to the row address selection signals. The number of the target word lines is fixed.

A third aspect of the embodiments of the disclosure provides a refresh method applied to a memory. The method includes the following operations.

Row address selection signals and a preset number of bank address selection signals are determined.

Target memory banks are selected according to the preset number of bank address selection signals, and target word lines in the target memory banks are determined according to the row address selection signals. The number of the target word lines is fixed.

Refreshing processing is performed on the target word lines.

DETAILED DESCRIPTION

Figure 1:
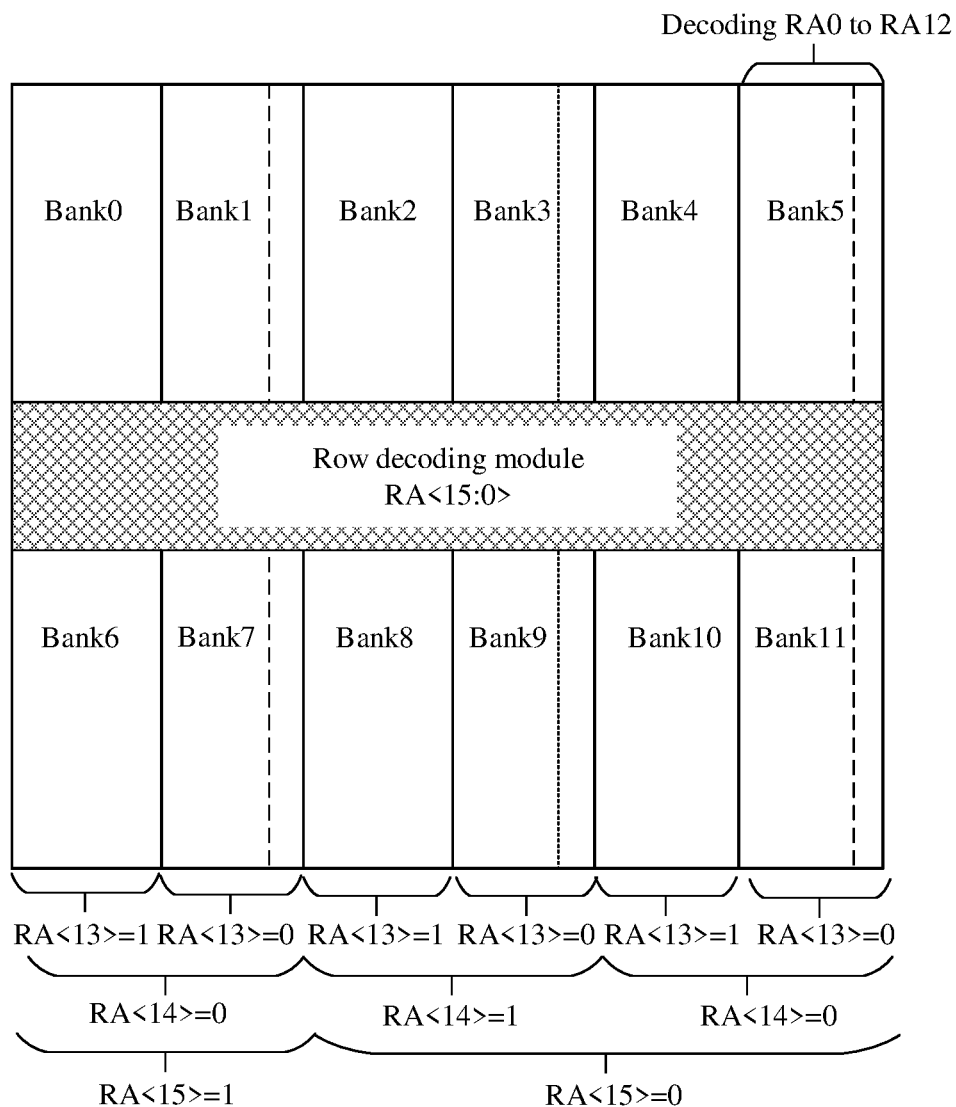
FIG. 1 is a schematic diagram of address decoding of a 12G chip provided by embodiments of the disclosure.

The technical solutions in embodiments of the disclosure are described clearly and completely with reference to the drawings in the embodiments of the disclosure. It can be understood that the specific embodiments described herein are merely used to explain the application, and are not intended to limit the application. In addition, it should be noted that, for the convenience of description, only the parts related to the application are shown in the drawings.

Unless otherwise specified, all technical and scientific terms used herein have the same meanings as commonly understood by those skilled in the technical field to which the disclosure belongs. The terms used herein are for the purpose of describing the embodiments of the disclosure only, and are not intended to limit the disclosure.

In the following description, the expression "some embodiments" describes subsets of all possible embodiments, but it can be understood that "some embodiments" may be the same subset or different subsets of all the possible embodiments, and can be combined with each other without conflict.

It should be pointed out that the terms "first\second\third" involved in the embodiments of the disclosure are only used to distinguish similar objects, and do not represent a specific ordering of objects. It can be understood that "first\second\third" can be interchanged in a specific order or sequence where permitted, so that the embodiments of the disclosure described herein are implemented in orders other than those illustrated or described herein.

A dynamic memory includes a large number of memory units, and these memory units are divided into a plurality of banks for management. In a bank, each memory cell shares electrical connections with other memory cells in rows and columns, the electrical connection in a horizontal direction is referred to as "word lines" and the electrical connection in a vertical direction is referred to as "bit lines". In order to maintain stored data, each memory cell must be refreshed at intervals. According to industry standards, in each refresh operation, one or more word lines are turned on, and then the memory cells on the word lines are refreshed.

Generally speaking, the storage capacity of a bank is 1G (G represents gigabyte), and the number of banks included in chips having different storage capacities are different. Exemplarily, FIG. 1 shows a schematic diagram of address decoding of a 12G chip provided by embodiments of the disclosure. As shown in FIG. 1, the memory cells of the 12G chip are divided into 12 banks, i.e., Bank 0 to Bank 11.

For a refresh operation of the 12G chip, a 15-bit address signal CBR<14:0> is generated by a refresh counter; then, an address mixer receives the address signal CBR<14:0>, and outputs RA<14:0> in one-to-one correspondences and also outputs fixed RA<15>. RA<12:0> are a row address selection signals, and used for selecting a target word line in a target bank, and RA<15:13> are bank address selection signals, and used for determining a target bank among the plurality of banks. In addition, in a decoding process, an inverted signal of the address signal is generally introduced to indicate that the signal is equal to 0. In other words, RA<13>=0 means that RA13B=1, RA13B is an inverted signal of RA<13>, and others are similar.

At present, since the address mixer can only obtain the 15-bit signal from the refresh counter, and RA15=1 and RA15B=1 are forced, that is, both RA15=1 and RA15=0 are valid. Under a current address setting rule, as shown in FIG. 1, there is no an address combination of RA<14>=1 and RA<15>=1 in the 12G chip. In this case, if RA<14>=0 and RA<13>=0, and one word line in each of Bank 1, Bank 7, Bank 5, and Bank 11 is selected (see the "---" part in the drawing), four word lines are turned on in the refresh operation. However, if RA<14>=1 and RA<13>=0, and one word line in each of Bank 3 and Bank 9 is selected (see the " . . . " part FIG. 1), two word lines are turned on in the refresh operation.

In this way, since different numbers of word lines are turned on in each refresh operation, a refresh current fluctuates, and a power supply is also disturbed. Other memories with a non-binary structural capacity also have similar problems. It should be understood that the non-binary structural capacity means that the structural capacity is not an integer power of 2.

The embodiments of the disclosure provide a refresh circuit. For each refresh operation, a row address selection signal and a preset number of bank address selection signals are generated, and target memory banks are selected by using the preset number of bank address selection signals, a target word lines is selected in each target memory bank by using the row address selection signals. Therefore, the same number of word lines is turned on in each refresh operation, so as to alleviate the problem that a refresh current fluctuates, thereby avoiding interference on a power supply.

The embodiments of the disclosure are described below in detail with reference to the drawings.

Figure 2:
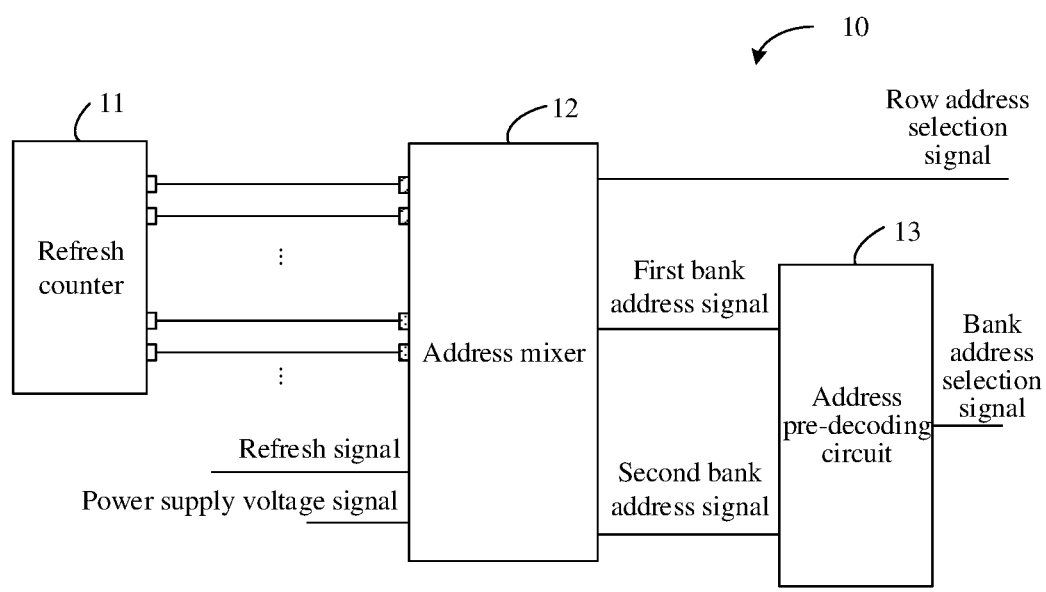
FIG. 2 is a schematic structural diagram of a refresh circuit provided by embodiments of the disclosure.

In an embodiment of the disclosure, FIG. 2 shows a schematic structural diagram of a refresh circuit 10 provided by embodiments of the disclosure. As shown in FIG. 2, the refresh circuit 10 may include a refresh counter 11, an address mixer 12 and an address pre-decoding circuit 13.

The refresh counter 11 includes a plurality of address pins, and is configured to output address signals through the plurality of address pins.

The address mixer 12 includes a plurality of row address pins and a plurality of bank address pins. The row address pins and the bank address pins are connected to different address pins respectively. The address mixer 12 is configured to output row address selection signals according to the address signals received by the row address pins, output first bank address signals according to the address signals received by the bank address pins, receive a refresh signal and a power supply voltage signal, and output fixed second bank address signals according to the refresh signal and the power supply voltage signal.

The address pre-decoding circuit 13 is configured to receive the first bank address signals and the second bank address signals, and output a preset number of bank address selection signals according to the first bank address signals and the second bank address signals.

It should be noted that the refresh circuit 10 according to the embodiments of the disclosure is applied to a dynamic memory, and is applied to a dynamic memory with a non-binary structural capacity (e.g., 6G, 10G, 12G, etc.).

It should be noted that the refresh signal is used for indicating whether to perform a refresh operation, that is, the refresh signal is always in a valid state (or referred to as a certain fixed state) in an execution process of the refresh operation. The bank address selection signal is used for determining a selected target bank among a plurality of banks, and the row address selection signal is used for determining a selected target word line in each target bank.

The refresh circuit 10 is described below with reference to a signal processing process.

First, when a refresh operation needs to be performed, the refresh counter 11 generates address signals corresponding to the refresh operation. The address signals can be divided into address signals of a first type for addressing a word line and address signals of a second type for addressing a bank.

Second, the address mixer 12 receives the address signals of the first type through the row address pins (the part filled with oblique lines in FIG. 2), and generates row address selection signals. The address mixer 12 receives the address signals of the second type through the bank address pins (the part filled with dots in FIG. 2), and generates first bank address signals. In addition, the address mixer 12 further receives a refresh signal and a power supply voltage signal from the outside, and generates second bank address signals. It should be understood that in the process of executing the refresh operation, since a state of each of the refresh signal and the power supply voltage signal is fixed, a state of the second bank address signal is also fixed.

Finally, the address pre-decoding circuit 13 performs decoding according to the first bank address signals and the second bank address signals to obtain a preset number of bank address selection signals. Here, the bank address selection signal is used for selecting a fixed number of banks.

In this way, target memory banks are selected by using the preset number of bank address selection signals, a target word line is selected in each target memory bank by using the row address selection signals, so that the same number of word lines are turned on in each refresh operation, so as to alleviate the problem that a refresh current fluctuates, thereby avoiding interference on a power supply.

It should also be noted that, two row address pins and two bank address pins are shown in the address mixer 12 in FIG. 2, but more or less row address pins and more or less bank address pins are contained in practical application scenarios.

In some embodiments, the address pre-decoding circuit 13 may include a plurality of pre-decoding sub-circuits.

The pre-decoding sub-circuits receive a part of the first bank address signals and a part of the second bank address signals, and are configured to perform decoding processing on the received signals, and output a bank address selection signal.

Here, the first bank address signals received by every preset number of pre-decoding sub-circuits are unchanged.

It should be understood that the pre-decoding sub-circuits only perform decoding processing on a specific combination of signals to obtain a bank address selection signal. It can also be understood that in a case that the pre-decoding sub-circuit decodes successfully, a bank address selection signal is outputted.

In this way, since the state of the second bank address signals is fixed, whether the decoding of the pre-decoding sub-circuits succeeds or not depends on the first bank address signals. In the embodiments of the disclosure, since the first bank address signals received by every preset number of pre-decoding sub-circuits are unchanged, a preset number of pre-decoding sub-circuits decodes successfully in each refresh operation, so as to output a preset number of bank address selection signals, thereby ensuring that the number of banks selected in each refresh is fixed, and the number of word lines turned on each time is fixed.

In some embodiments, the first bank address signals include a plurality of pairs of first bank address sub-signals, and each pair of first bank address sub-signals includes two signals having opposite potentials. Each pre-decoding sub-circuit receives one signal of each pair of first bank address sub-signals.

It should be noted that the address mixer determines an address signal received through each bank address pin as a first bank address sub-signal, and performs inversion processing on the first bank address sub-signal to obtain an inverted signal of the first bank address sub-signal. In this way, the first bank address sub-signal and the inverted signal of the first bank address sub-signal constitute a pair of first bank address sub-signals.

Figure 3:
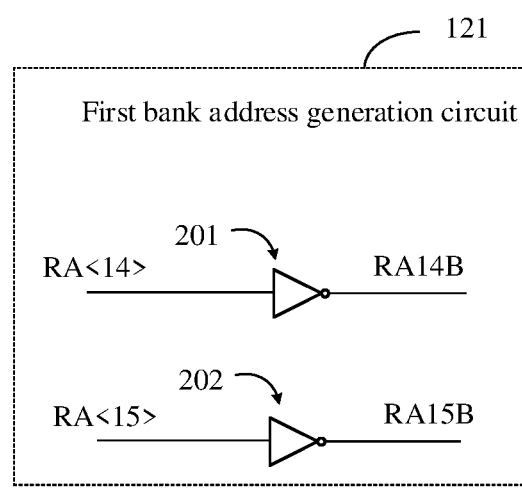
FIG. 3 is a schematic partial structural diagram of a refresh circuit provided by embodiments of the disclosure.

In some embodiments, as shown in FIG. 3, the address mixer 12 includes a first bank address generation circuit 121, the first bank address generation circuit 121 includes a plurality of NOT gates (see NOT gate 201 and NOT gate 202 in FIG. 3), and each NOT gate is configured to perform inversion processing on a first bank address sub-signal (see RA<14> or RA<15> in FIG. 3) to obtain an inverted signal of the first bank address sub-signal (see RA14B or RA15B in FIG. 3).

In this case, RA<14> and RA14B constitute a pair of first bank address sub-signals, and RA<15> and RA15B constitute another pair of first bank address sub-signals.

Figure 4:
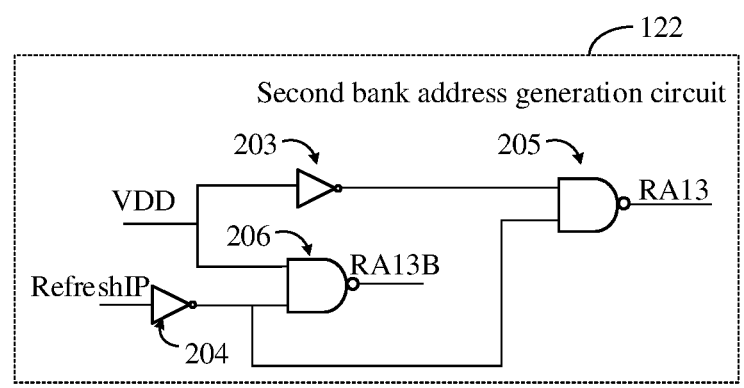
FIG. 4 is a schematic partial structural diagram of another refresh circuit provided by embodiments of the disclosure.

It should be understood that, in FIG. 4, only two pairs of first bank address sub-signals are taken as an example for explanation, but in practical application scenarios, the number of the first bank address sub-signals may be greater than or less than two.

In some embodiments, the second bank address signal may include two second bank address sub-signals, and the two second bank address sub-signals have identical potentials. Each pre-decoding sub-circuit receives one signal of the two second bank address sub-signals.

It should be noted that, in the refresh operation, potentials of the two second bank address sub-signals are both in a first level state.

In this way, an input signal of the pre-decoding sub-circuit includes the first bank address signal and the second bank address signal. Since the first bank address signals received by every preset number of pre-decoding sub-circuits are unchanged, and the second bank address signals have a fixed state, a preset number of pre-decoding sub-circuits output valid bank address selection signals by decoding in each refresh operation, to ensure that the number of banks selected is fixed in each refresh, and the number of word lines turned on each time is fixed.

In a specific embodiment, the refresh signal is in a high-level state during the refresh operation, and the second bank address sub-signals are in the high-level state during the refresh operation. In this case, as shown in FIG. 4, the address mixer 12 may further include a second bank address generation circuit 122, and the second bank address generation circuit 122 includes a first NOT gate 203, a second NOT gate 204, a first NAND gate 205 and a second NAND gate 206. An input end of the first NOT gate 203 is connected to a power supply voltage signal VDD, and an input end of the second NOT gate 204 is connected to a refresh signal RefreshIP.

Two input ends of the first NAND gate 205 are connected to an output end of the first NOT gate 203 and an output end of the second NOT gate 204 respectively, and an output end of the first NAND gate 205 is configured to output one second bank address sub-signal RA13.

Two input ends of the second NAND gate 206 are connected to the power supply voltage signal VDD and the output end of the second NOT gate 204 respectively, and an output end of the second NAND gate 206 is configured to output the other second bank address sub-signal RA13B.

In this way, during the refresh operation, the refresh signal RefreshIP and the power supply voltage signal VDD are both in the high-level state, and the second bank address sub-signal RA13 and the second bank address sub-signal RA13B are also in the high-level state.

In some embodiments, the pre-decoding sub-circuit may include a logical operation circuit.

An input end of the logical operation circuit is connected to one signal in each pair of first bank address sub-signals and one signal in the two second bank address sub-signals, and an output end of the logical operation circuit is configured to output a bank address selection signal.

It should be noted that, when an operation value is 1, the logical operation circuit outputs the bank address selection signal to select a bank corresponding to the bank address selection signal. When the operation value is 0, the logical operation circuit does not output the bank address selection signal (i.e., the output signal is invalid), to not select the bank.

Since the level states of the two second bank address sub-signals are fixed, the operation value of the logical operation circuit depends on the received first bank address signals. According to the foregoing content, since the first bank address signal received by every preset number of logical operation circuits are unchanged, a preset number of pre-decoding sub-circuits decodes successfully in each refresh process, so as to output a preset number of bank address selection signals, thereby ensuring that the number of banks selected is fixed in each refresh, and the number of word lines turned on each time is fixed.

In some embodiments, the first bank address signals include two pairs of first bank address sub-signals. In addition, the address pre-decoding circuit includes six pre-decoding sub-circuits, and the first bank address signals received by every two pre-decoding sub-circuits are unchanged, that is, a preset number is 2.

Correspondingly, the number of the pre-decoding sub-circuits is even.

Figure 5:
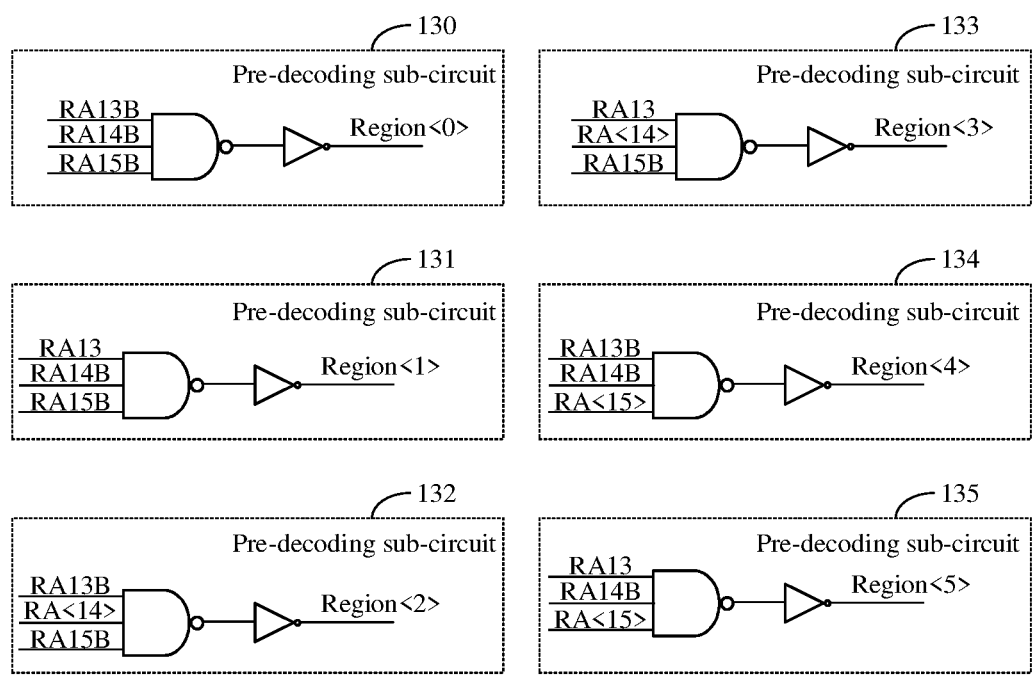
FIG. 5 is a schematic partial structural diagram of another refresh circuit provided by embodiments of the disclosure.

Taking a 12G chip as an example, a specific structure of the pre-decoding circuit 13 is given below. As shown in FIG. 5, the pre-decoding circuit 13 includes six pre-decoding sub-circuits from a pre-decoding sub-circuit 130 to a pre-decoding sub-circuit 135, which are configured to output a bank address selection signal Region 0 to a bank address selection signal Region 5 respectively.

Each pre-decoding sub-circuit includes a three-input NAND gate and a NOT gate, which are equivalent to a logical operation circuit. The three-input NAND gate receives one signal from RA<14> and RA14B, a signal from RA<15> and RA15B, and a signal from R13 and R13B. An output end of the three-input NAND gate is connected to an input end of the NOT gate. When an operation result of the NOT gate is 1, the bank address selection signal is outputted (a level value of a signal Region is 1), and when the operation result of the NOT gate is 0, no bank address selection signal is outputted (the level value of the signal Region is 0).

As shown in FIG. 5, both the pre-decoding sub-circuit 130 and the pre-decoding sub-circuit 131 are configured to receive RA14B and RA15B from the first bank address signals, and when RA14=0 and RA15=0, level values of Region<0> and Region<1> are 1. It can be known from FIG. 1 that in this case, Bank 4, Bank 5, Bank 10 and Bank 11 are selected, and then the target word lines are selected in these four banks by using the row address selection signals.

Both the pre-decoding sub-circuit 132 and the pre-decoding sub-circuit 133 are configured to receive RA<14> and RA15B from the first bank address signals, and when RA14=1 and RA15=0, level values of Region<2> and Region<3> are 1. It can be known from FIG. 1 that in this case, Bank 2, Bank 3, Bank 8, and Bank 9 are selected, and then the target word lines are selected in these four banks by using the row address selection signal.

Both the pre-decoding sub-circuit 134 and the pre-decoding sub-circuit 135 are configured to receive RA14B and RA<15> from the first bank address signals, and when RA14=0 and RA15=1, level values of Region<4> and Region<5> are 1. It can be known from FIG. 1 that in this case, Bank 0, Bank 1, Bank 6 and Bank 7 are selected, and the target word lines are selected in these four banks by using the row address selection signal.

In addition, although the two pre-decoding sub-circuits which receive the same first bank address signals receive different second bank address signals R13/R13B respectively, the second bank address signals will not affect a decoding result since R13=R13B=1.

It should be understood that a decoding mode shown in FIG. 5 is only an example and not a limitation, and a specific decoding combination needs to be determined according to an actual product.

It should also be noted that the two steps of "selecting the target word lines according to the row address selection signals" and "selecting the target memory banks according to the bank address selection signals" can be performed simultaneously, or can be performed sequentially according to an actual application scenario, which is not limited in the embodiments of the disclosure.

In this way, in each refresh process, the number of the first bank address selection signals is 2, and the target word lines (which is determined by the row address selection signals) in four banks are turned on, thereby alleviating the problem that the refresh current fluctuates while reducing interference on a power supply.

In some embodiments, the address pins of the refresh counter 11 include address pins of a first type and address pins of a second type.

The address pins of the first type are connected to the row address pins, and configured to output the address signals of the first type to the row address pins.

The address pins of the second type are connected to the bank address pins, and configured to output the address signals of the second type to the bank address pins.

Here, in the address signals of the first type and the address signals of the second type, the address signals of the first type are low-bit signals in the address signals, and the address signals of the second type are high-bit signals in the address signals.

In some embodiments, the number of the address pins of the first type is 13 and the number of the address pins of the second type is 2 in the refresh counter 11. In the address mixer 12, the number of the row address pins is 13, and the number of the bank address pins is 3.

The a-th row address pin is correspondingly connected to the a-th address pin of the first type, and is configured to receive the a-th address signal of the first type and output the a-th row address selection signal.

The first bank address pin is configured to receive the power supply voltage signal.

The second bank address pin is connected to the first address pin of the second type, and is configured to receive the first address signal of the second type.

The third bank address pin is connected to the second address pin of the second type, and is configured to receive the second address signal of the second type.

The address pins of the first type, the address pins of the second type, the row address pins and the bank address pins are sequentially numbered according to an ascending order of signal bits.

It should be noted that the output signals of the refresh counter 11 may be represented as CBR<14:0>, the address signals of the first type are represented by CBR<12:0>, and the address signals of the second type are represented by CBR<14:13>.

The output signals of the address mixer 12 may be represented as RA<15:0>, the row address signals may be represented as RA<12:0>, the first bank address signals may be represented as RA<15>, RA15B, RA<14>, and RA14B, and the second bank address signals are represented as RA13 and RA13B. RA<15> and RA15B are a pair of signals inverted to each other, RA<14> and RA14B are a pair of signals inverted to each other, and RA13 and RA13B have identical level state.

In this case, referring to Table 1, a pin connection relationship and a signal association relation between the refresh counter 11 and the address mixer 12 are described as follows:

(1) The first pin to thirteenth pin (i.e., the row address pins) of the address mixer are connected to the first pin to thirteenth pin (i.e., the pins of the first type) of the refresh counter in one-to-one correspondences, and are configured to receive CBR<0> to CBR<12>, and generate RA<0> to RA<12>.

(2) The fourteenth pin (i.e., the first bank address pin) of the address mixer is configured to receive the power supply voltage signal, and subsequently together with the refresh signal generates RA13 and RA13B, so that RA13=RA13B=1 during the refresh operation.

(3) The fifteenth pin (i.e., the second bank address pin) of the address mixer is connected to the fourteenth pin (i.e., the second pin) of the refresh counter, and is configured to receive CBR<13>, generate RA<14>, and perform inversion processing to obtain RA14B. Similarly, the sixteenth pin (i.e., the third bank address pin) of the address mixer is connected to the fifteenth pin of the refresh counter, and configured to receive CBR<14>, and generate RA<15>.

RA<15>, RA15B, RA<14>, RA14B, RA13 and RA13B are subsequently sent to the address pre-decoding circuit for decoding processing, so as to obtain the bank address selection signals for bank addressing, the bank address selection signals and the row address select signals together determines the word lines that are turned on in the refresh operation.

TABLE 1

| RA | CBR |
|---|---|
| RA<12:0> | CBR<12:0> |
| RA<13> | — |
| RA<14> | CBR<13> |
| RA<15> | CBR<14> |

It should be noted that, the signals received by the pins of the address mixer 12 other than the thirteenth pin are the same as those outputted by the pins. Therefore, the signals received and outputted by the pins are represented as the same symbols. For example, RA<15> represents a signal received by the fifteenth pin in the address mixer 12, and also represents a signal (or referred to as the first bank address sub-signal) outputted by the fifteenth pin. Since the signal received by the thirteenth pin in the address mixer 12 is different from the signal outputted by the thirteenth pin, RA<13> represents the signal received by the thirteenth pin in the address mixer 12, and RA13 represents the signal outputted by the thirteenth pin.

It should also be noted that the row address selection signals may also include multiple pairs of signals at different level states. That is, the row address selection signals may include RA<12:0> and respective inverted signals of RA<12:0>. Correspondingly, the address mixer 12 may include a row address generation circuit configured to generate the respective inverted signals of RA<12:0>, and reference can be made to the first bank address generation circuit 121 in FIG. 3 for the structure of the row address generation circuit.

In this way, by connecting the output pins of the refresh counter 11 and the receiving pins of the address mixer 12 in a staggering manner, CBR<12:0> are correspondingly connected to RA<12:0>, CBR<13> is connected with RA<14>, and CBR<14> is connected with RA<15>. In each refresh operation, RA13=1 and RA13B=1 are forced. Thus, two regions (four banks) are selected in the refresh operation, so that the same number of word lines are turned on in each refresh operation, thereby avoiding a refresh current from fluctuating, and reducing interference on a power supply. Specifically, in the embodiments of the disclosure, the pre-decoding sub-circuit receive one signal from a signal pair including RA<15> and RA15B, one signal from a signal pair including RA<14> and RA14B, and one signal from a signal pair including RA13 and RA13B, and the same signal from a signal pair including RA<15> and RA15B and the same signal from a signal pair including RA<14> and RA14B are received by every preset number of pre-decoding sub-circuits, so that a preset number of valid address selection signals are outputted each time, so as to ensure that the number of banks selected in each refresh is fixed, and the number of word lines turned on each time is fixed, thereby avoiding a refresh current from fluctuating while avoiding the interference on the power supply.

For other chips with a non-binary storage capacity, adaptive adjustment can be made based on the content provided by the embodiments of the disclosure, so that the number of word lines turned on in each refresh operation is fixed, and therefore these solutions also fall within the scope of protection of the embodiments of the disclosure.

The embodiments of the disclosure provide a refresh circuit. For each refresh operation, row address selection signals and a preset number of bank address selection signals are generated, and target memory banks are selected by using the preset number of bank address selection signals, target word line are selected in each target memory bank by using the row address selection signals, so that the same number of word lines are turned on in each refresh operation, so as to alleviate the problem that a refresh current fluctuates, thereby avoiding interference on a power supply.

Figure 6:
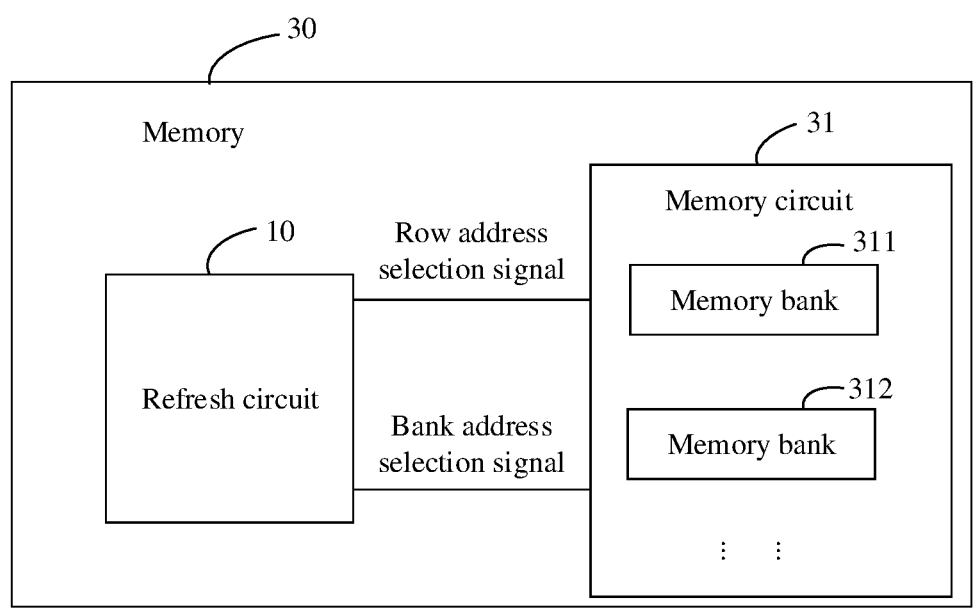
FIG. 6 is a schematic structural diagram of a memory provided by embodiments of the disclosure.

In another embodiment of the disclosure, FIG. 6 shows a schematic structural diagram of a memory 30 provided by embodiments of the disclosure. As shown in FIG. 6, the memory 30 may include a refresh circuit 10 and a memory circuit 31, and the memory circuit 31 includes a plurality of memory banks (e.g., a memory bank 311, a memory bank 312 or the like).

The refresh circuit 10 is configured to output row address selection signals and a preset number of bank address selection signals.

The memory circuit 31 is configured to select target memory banks according to the preset number of bank address selection signals, and determine target word lines in the target memory banks according to the row address selection signals. The number of the target word lines is fixed.

It should be noted that the memory may be a dynamic semiconductor memory, and the memory circuit 31 refers to a set of all memory units in the memory. In addition, the memory banks refer to the bank described above.

As shown in FIG. 6, two memory banks are shown in the memory circuit 31, but in practical application scenarios, the number of the memory banks may be more than or less than two.

In this way, since the number of the bank address selection signals is fixed, it is ensured that the same number of banks are selected in each refresh operation, and then the same number of word lines are turned on each time, so as to alleviate the problem that a refresh current fluctuates, and generate no interference on a power supply, thereby improving semiconductor performance.

In some embodiments, the memory circuit 31 includes 12 memory banks, the number of the bank address selection signals is 2, the number of the target memory banks is 4, and the number of the target word lines is 4.

In this way, for a 12G chip, four banks can be selected each time, and one word line is turned on in each bank, that is, four word lines are refreshed each time. For other chips with a non-binary storage capacity, adaptive adjustment can be made based on the content provided by the embodiments of the disclosure, so that the number of word lines turned on in each refresh operation is fixed, and therefore, these solutions also fall within the scope of protection of the embodiments of the disclosure.

The embodiments of the disclosure provide a memory. For each refresh operation, the refresh circuit generates row address selection signals and a preset number of bank address selection signals, and target memory banks are selected by using the preset number of bank address selection signals, a target word line is selected in each target memory bank by using the row address selection signals, so that the same number of word lines are turned on in each refresh operation, so as to alleviate the problem that a refresh current fluctuates, thereby avoiding interference on a power supply.

Figure 7:
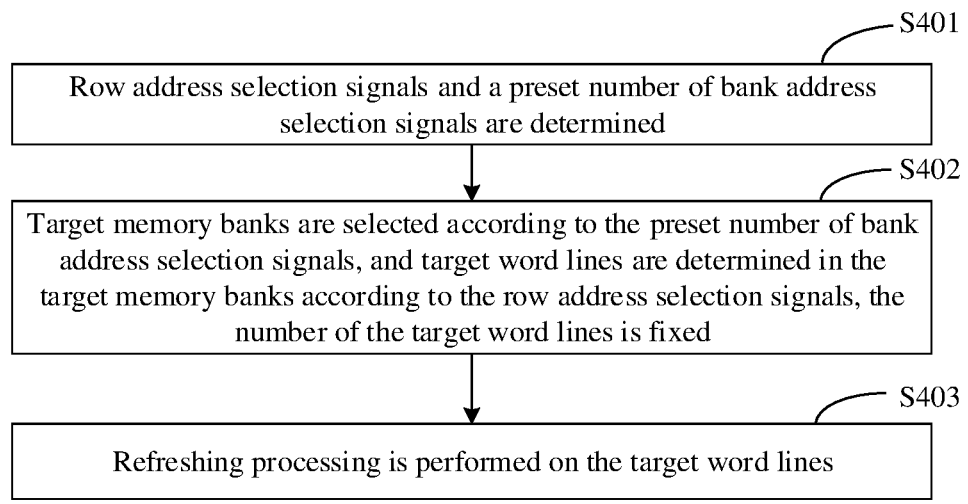
FIG. 7 is a schematic flowchart of a refresh method provided by embodiments of the disclosure.

In still another embodiment of the disclosure, FIG. 7 shows a schematic flowchart of a refresh method provided by embodiments of the disclosure. As shown in FIG. 7, the method may include the following operations S401 to S403.

At S401, row address selection signals and a preset number of bank address selection signals are determined.

It should be noted that, the refresh method provided by the embodiments of the disclosure is applied to the memory 30 described above, so as to ensure that the number of word lines turned on in each refresh process is fixed, thereby alleviating the problem that a refresh current fluctuates while causing no interference on a power supply.

At S402, target memory banks are selected according to the preset number of bank address selection signals, and target word lines are determined in the target memory banks according to the row address selection signals. The number of the target word lines is fixed.

It should be noted that bank address selection signals are used for selecting a fixed number of banks. In this way, the target word line is selected in each target memory bank by using the row address selection signals, so that the number of selected word lines is fixed.

In some embodiments, the memory includes a plurality of pre-decoding sub-circuits; the operation of determining a row address selection signal and a preset number of bank address selection signals may include operations as follows.

A plurality of address signals, a refresh signal, and a power supply voltage signal are determined.

First bank address signals and the row address selection signals are outputted according to the plurality of address signals.

Fixed second bank address signals are outputted according to the refresh signal and the power supply voltage signal, Decoding processing is performed on a part of the first bank address signals and a part of the second bank address signals by the pre-decoding sub-circuit to obtain a bank address selection signal.

The first bank address signals received by every preset number of pre-decoding sub-circuits are unchanged.

It should be noted that in an execution process of the refresh operation, the states of the refresh signal and the power supply voltage signal are both fixed, and therefore, the second bank address signals are at a fixed level state, and the level state of the second bank address signals depends on the refresh signal.

In this way, since the state of the second bank address signals is fixed, whether the pre-decoding sub-circuits decode successfully actually depends on the first bank address signals. In the embodiments of the disclosure, since the same first bank address signals are received by every preset number of pre-decoding sub-circuits, a preset number of pre-decoding sub-circuits decodes successfully in each refresh operation, so as to output a preset number of bank address selection signals, thereby ensuring that the number of banks selected in each refresh is fixed, and the number of word lines turned on each time is fixed.

In some embodiments, the first bank address signals include a plurality of pairs of first bank address sub-signals, and each pair of first bank address sub-signals includes two signals having opposite potentials. The second bank address signal includes two second bank address sub-signals having identical potential.

It should be noted that each pre-decoding sub-circuit receives one signal from each pair of the first bank address sub-signals, and receives one signal from the two second bank address sub-signals, thereby completing decoding processing.

In some embodiments, the address signals include address signals of a first type and address signals of a second type. The operation of outputting first bank address signals and the row address selection signals according to the plurality of address signals may include operations as follows.

The row address selection signals are determined according to the address signals of the first type.

The first bank address signals are determined according to the address signals of the second type.

In the address signals of the first type and the address signals of the second type, the address signals of the first type are low-bit signals in the address signals, and the address signals of the second type are high-bit signals in the address signals.

Exemplarily, for a 12G chip, the address signals may be represented as CBR<14:0>, the address signals of the first type are low-bit signals CBR<12:0>, and the address signals of the second type are high-bit signals CBR<14:13>.

The row address signals are represented as RA<12:0>, the first bank address signals are represented as RA<15>, RA15B, RA<14> and RA14B, and the second bank address signals are represented as RA13 and RA13B. RA<15> and RA15B are a pair of signals inverted to each other, RA<14> and RA14B are a pair of signals inverted to each other, and RA13 and RA13B have identical level state.

CBR<12:0> is used for generating RA<12:0> in one-to-one correspondences, CBR<13> is used for generating RA<14>, CBR<14> is used for generating RA<15>, and RA13 and RA13B are signals having a fixed level, for example, RA13 and RA13B=1.

In this way, each pre-decoding sub-circuit receives one signal from a signal part including RA<15> and RA15B, one signal from a signal part including RA<14> and RA14B, and one signal from a signal part including RA13 and RA13B. The signals from the signal part including RA<15> and RA15B and from the signal part including RA<14> and RA14B received by every preset number of pre-decoding sub-circuits are unchanged, so that a preset number of valid bank address selection signals are outputted each time, thereby ensuring that the number of banks selected in each refresh is fixed, and the number of word lines turned on each time is fixed.

At S403, refreshing processing is performed on the target word lines.

In this way, the fixed number of word lines are selected each time according to the preset number of bank address selection signals and the row address selection signals, and the number of the word lines turned on in the refresh operation is fixed, thereby reducing the fluctuation of a refresh current, improving the problem that the refresh current fluctuates while avoiding interference on a power supply.

The embodiments of the disclosure provide a refresh method. For each refresh operation, row address selection signals and a preset number of bank address selection signals are generated, and target memory banks are selected by using the preset number of bank address selection signals, a target word line is selected in each target memory bank by using the row address selection signals, so that the same number of word lines are turned on in each refresh operation, so as to alleviate the problem that a refresh current fluctuates, and avoid interference on a power supply.

The foregoing are only preferred embodiments of the disclosure, and are not intended to limit the scope of protection of the disclosure.

It should be noted that, the terms "including", "comprising" or any other variants thereof in the disclosure are intended to cover non-exclusive inclusion, so that a process, method, article or apparatus including a series of elements not only includes those elements, but also includes other elements that are not explicitly listed, or elements inherent to the process, method, article or apparatus. Without more limitations, the element defined by the sentence "including a . . . " does not exclude the existence of other identical elements in the process, method, article or apparatus including the elements.

The serial numbers of the embodiments of the disclosure are only for the purpose of description but do not represent the preference of the embodiments.

The methods disclosed in the method embodiments provided in the disclosure can be combined arbitrarily as long as there is no conflict to obtain new method embodiments.

The features disclosed in the product embodiments provided in the disclosure can be combined arbitrarily as long as there is no conflict to obtain new product embodiments.

The features disclosed in the method or device embodiments provided in the disclosure can be combined arbitrarily as long as there is no conflict to obtain new method or device embodiments.

Only implementations of the disclosure are described above. However, the scope of protection of the disclosure is not limited thereto. Within the technical scope disclosed by the disclosure, any variation or substitution that can be easily conceived by those skilled in the art should all fall within the scope of protection of the disclosure. Therefore, the scope of protection of the disclosure should be subject to the scope of protection of the claims.

What is claimed is:

1. A refresh circuit, comprising:
    a refresh counter comprising a plurality of address pins and configured to output address signals through the plurality of address pins;
    an address mixer comprising a plurality of row address pins and a plurality of bank address pins which are connected to the different address pins respectively, wherein the address mixer is configured to output row address selection signals according to the address signals received by the row address pins, output first bank address signals according to the address signals received by the bank address pins, receive a refresh signal and a power supply voltage signal, and output fixed second bank address signals according to the refresh signal and the power supply voltage signal; and
    an address pre-decoding circuit configured to receive the first bank address signals and the second bank address signals, and configured to output a preset number of bank address selection signals according to the first bank address signals and the second bank address signals.

2. The refresh circuit of claim 1, wherein the address pre-decoding circuit comprises a plurality of pre-decoding sub-circuits, wherein
    the pre-decoding sub-circuit is configured to receive a part of the first bank address signals and a part of the second bank address signals, and is configured to perform decoding processing on the received signals, and output a bank address selection signal; and
    the first bank address signals received by every preset number of pre-decoding sub-circuits are unchanged.

3. The refresh circuit of claim 2, wherein the first bank address signals comprise a plurality of pairs of first bank address sub-signals, and each pair of first bank address sub-signals comprise two signals having opposite potentials; and
    each of the pre-decoding sub-circuits receives one signal from each pair of first bank address sub-signals.

4. The refresh circuit of claim 3, wherein the second bank address signals comprise two second bank address sub-signals, and the two second bank address sub-signals have identical potentials; and
    each of the pre-decoding sub-circuits further receives one signal of the two second bank address sub-signals.

5. The refresh circuit of claim 4, wherein the address mixer comprises a second bank address generation circuit which comprises a first NOT gate, a second NOT gate, a first NAND gate, and a second NAND gate, wherein
    an input end of the first NOT gate is connected to the power supply voltage signal, and an input end of the second NOT gate is connected to the refresh signal;
    two input ends of the first NAND gate are connected to an output end of the first NAND gate and an output end of the second NOT gate respectively, and an output end of the first NAND gate is configured to output one of the two second bank address sub-signals; and
    two input ends of the second NAND gate are connected to the power supply voltage signal and the output end of the second NOT gate respectively, and an output end of the second NAND gate is configured to output the other of the two second bank address sub-signals.

6. The refresh circuit of claim 4, wherein each of the pre-decoding sub-circuits comprise a logical operation circuit, wherein
    an input end of the logical operation circuit is connected to one signal from each pair of first bank address sub-signals and one signal in the two second bank address sub-signals; and
    an output end of the logical operation circuit is configured to output a bank address selection signal.

7. The refresh circuit of claim 6, wherein the number of the pre-coding sub-circuits is even.

8. The refresh circuit of claim 7, wherein the first bank address signals comprise two pairs of first bank address sub-signals; and
    the address pre-decoding circuit comprises six pre-decoding sub-circuits, and the first bank address signals received by every two of the six pre-decoding sub-circuits are unchanged.

9. The refresh circuit of claim 1, wherein the address pins comprise address pins of a first type and address pins of a second type, wherein
    the address pins of the first type are connected to the row address pins, and are configured to output address signals of a first type to the row address pins; and
    the address pins of the second type are connected to the bank address pins, and are configured to output address signals of a second type to the bank address pins,
    wherein in the address signals of the first type and address signals of the second type, the address signals of the first type are low-bit signals in the address signals, and the address signals of the second type are high-bit signals in the address signals.

10. The refresh circuit of claim 9, wherein the number of address pins of the first type is 13 and the number of address pins of the second type is 2 in the refresh counter, and the number of the row address pins is 13 and the number of the bank address pins is 3 in the address mixer;
- an a-th row address pin is correspondingly connected to an a-th address pin of the first type, and is configured to receive an a-th address signal of the first type and output an a-th row address selection signal;
- a first bank address pin is configured to receive the power supply voltage signal;
- a second bank address pin is connected to a first address pin of the second type, and is configured to receive a first address signal of the second type; and
- a third bank address pin is connected to a second address pin of the second type, and is configured to receive a second address signal of the second type; and
- the address pins of the first type, the address pins of the second type, the row address pins and the bank address pins are sequentially numbered according to an ascending order of signal bits.

11. A memory comprising a refresh circuit and a memory circuit, the memory circuit comprising a plurality of memory banks, wherein
- the refresh circuit is configured to output row address selection signals and a preset number of bank address selection signals; and
- the memory circuit is configured to select target memory banks according to the preset number of bank address selection signals, and determine target word lines in the target memory banks according to the row address selection signals, wherein the number of the target word lines is fixed.

12. The memory of claim 11, wherein the memory circuit comprises 12 memory banks, a number of the bank address selection signals is 2, a number of the target memory banks is 4, and a number of the target word lines is 4.

13. A refresh method applied to a memory, the method comprising:
- determining row address selection signals and a preset number of bank address selection signals;
- selecting target memory banks according to the preset number of bank address selection signals, and determining target word lines in the target memory banks according to the row address selection signals, wherein the number of the target word lines is fixed; and
- performing refreshing processing on the target word lines.

14. The refresh method of claim 13, wherein the memory comprises a plurality of pre-decoding sub-circuits, and the determining row address selection signals and a preset number of bank address selection signals comprises:
- determining a plurality of address signals, a refresh signal and a power supply voltage signal;
- outputting first bank address signals and the row address selection signals according to the plurality of address signals;
- outputting fixed second bank address signals according to the refresh signal and the power supply voltage signal; and
- performing decoding processing on a part of the first bank address signals and a part of the second bank address signals by the pre-decoding sub-circuit to obtain the bank address selection signal, wherein
- the first bank address signals received by every preset number of pre-decoding sub-circuits are unchanged.

15. The refresh method of claim 14, wherein the first bank address signals comprise a plurality of pairs of first bank address sub-signals, and each pair of first bank address sub-signals comprises two signals having opposite potentials; and
- the second bank address signals include two second bank address sub-signals having identical potential.

16. The refresh method of claim 14, wherein the address signals comprise address signals of a first type and address signals of a second type; and the outputting first bank address signals and the row address selection signals according to the plurality of address signals comprises:
- determining the row address selection signals according to the address signals of the first type; and
- determining the first bank address signals according to the address signals of the second type,
- wherein in the address signals of the first type and the address signals of the second type, the address signals of the first type are low-bit signals in the address signals, and the address signals of the second type are high-bit signals in the address signals.

* * * * *